(12) United States Patent
Reuter et al.

(10) Patent No.: US 12,370,573 B2
(45) Date of Patent: Jul. 29, 2025

(54) EQUIPMENT FRONT END MODULES WITH INDUCED GAS MIXING, AND METHODS OF USE THEREOF

(71) Applicant: Applied Materials, Inc., Santa Clara, CA (US)

(72) Inventors: Paul Benjamin Reuter, Austin, TX (US); Steven Trey Tindel, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 180 days.

(21) Appl. No.: 17/959,294

(22) Filed: Oct. 3, 2022

(65) Prior Publication Data

US 2023/0105742 A1  Apr. 6, 2023

Related U.S. Application Data

(60) Provisional application No. 63/252,884, filed on Oct. 6, 2021.

(51) Int. Cl.
| | | |
|---|---|---|
| *B05D 1/26* | (2006.01) | |
| *B05C 5/02* | (2006.01) | |
| *B05C 15/00* | (2006.01) | |

(52) U.S. Cl.
CPC .............. *B05D 1/26* (2013.01); *B05C 5/027* (2013.01); *B05C 15/00* (2013.01)

(58) Field of Classification Search
CPC ...... B05D 1/26; B05D 3/0406; B05D 3/0466; B05D 3/12; H01L 21/67017; H01L 21/67766; H01L 21/67769; H01L 21/67253; H01L 21/67196; B05C 5/027; B05C 5/0225; B05C 5/0283; B05C 5/0287; B05C 15/00
See application file for complete search history.

(56) References Cited

U.S. PATENT DOCUMENTS

| | | | |
|---|---|---|---|
| 10,403,514 B1 | 9/2019 | Hagino et al. | |
| 2017/0170044 A1* | 6/2017 | Okabe | ............... H01L 21/67017 |
| 2020/0101624 A1* | 4/2020 | Sakata | ..................... B25J 15/08 |
| 2020/0135523 A1* | 4/2020 | Reuter | ............. H01L 21/67766 |

(Continued)

FOREIGN PATENT DOCUMENTS

| | | |
|---|---|---|
| JP | 2003051431 A | 2/2003 |
| JP | 2004200669 A | 7/2004 |

(Continued)

OTHER PUBLICATIONS

International Search Report and Written Opinion for the International Application No. PCT/US2022/045804, mailed on Feb. 7, 2023, 11 pages.

*Primary Examiner* — Glenn F Myers
(74) *Attorney, Agent, or Firm* — Lowenstein Sandler LLP (57) ABSTRACT

An equipment front end module (EFEM) having walls, a first wall including one or more load ports and an EFEM chamber formed between the walls. The EFEM further includes an upper plenum at a top of the EFEM and including an opening into the EFEM chamber. Ducts provide a return gas flow path enabling recirculation of gas from the EFEM chamber to the upper plenum, the ducts proximate the one or more load ports. The one or more ducts includes flow elements configured to cause a low pressure condition at a location of the one or more load ports.

17 Claims, 8 Drawing Sheets

(56) References Cited

U.S. PATENT DOCUMENTS

| | | | |
|---|---|---|---|
| 2020/0211871 A1* | 7/2020 | Ryu | H01L 21/67766 |
| 2021/0028031 A1* | 1/2021 | Kawai | H01L 21/67196 |
| 2021/0090923 A1 | 3/2021 | Woo et al. | |
| 2021/0151724 A1* | 5/2021 | Kim | H01M 50/394 |

FOREIGN PATENT DOCUMENTS

| | | |
|---|---|---|
| JP | 2008172080 A | 7/2008 |
| JP | 2008263048 A | 10/2008 |
| JP | 2015146349 A | 8/2015 |
| JP | 2017092233 A | 5/2017 |
| JP | 2017-108048 A | 6/2017 |
| JP | 2018174259 A | 11/2018 |
| KR | 10-2018-0074276 A | 7/2018 |
| KR | 20210006679 A | 1/2021 |
| WO | 2020086709 A1 | 4/2020 |

* cited by examiner

EQUIPMENT FRONT END MODULES WITH INDUCED GAS MIXING, AND METHODS OF USE THEREOF

RELATED APPLICATIONS

This patent application claims the benefit under 35 U.S.C. § 119(e) of U.S. Provisional Application No. 63/252,884, filed Oct. 6, 2021.

FIELD

The present disclosure relates to electronic device manufacturing, and more specifically to equipment front end modules (EFEMs) having induced gas mixing and methods of use thereof.

BACKGROUND

Processing substrates in semiconductor electronic device manufacturing is generally carried out in multiple process tools, where substrates travel between process tools in substrate carriers, such as, e.g., front opening unified pods (FOUPs). A FOUP may be docked at a load port of an equipment front end module (EFEM), sometimes referred to as a factory interface (FI), where one or more substrates may be transferred to a load lock, a transfer chamber and/or a process chamber. Pre- and post-substrate exposure to moisture and oxygen can cause on substrate corrosion (e.g., etch), interlayer defects (e.g., film stress and resistivity, physical vapor deposition) and device non-uniformity (e.g., chemical vapor deposition passivation). Eliminating moisture and oxygen from the EFEM environment reduces and/or eliminates such device performance and yield challenges.

EFEMs provide a non-reactive environment for transferring substrates between the FOUPs and the load lock and/or chamber. This is achieved by sealing the interior volume of the EFEM as much as is practical and flooding the interior volume with a gas such as nitrogen that is generally non-reactive with substrate materials. The non-reactive gas forces out any reactive gases such as oxygen from the EFEM and also reduces/eliminates moisture from the EFEM. One or more load ports for docking to one or more substrate carriers may be arranged along a front face of the EFEM. The load ports of conventional EFEMs are bottom purged with nitrogen gas ($N_2$) to reduce the relative humidity (RH) and oxygen levels within the FOUP and EFEM during substrate processing and transport. The hardware used to implement the bottom purging and the use of pressurized $N_2$ are costly and add to the complexity of the EFEM. Improved systems, apparatus, and methods for maintaining a non-reactive environment within EFEMs and FOUPs at a lower cost and complexity are desired.

BRIEF SUMMARY

According to at least one embodiment, disclosed herein is an equipment front end module (EFEM), comprising: a plurality of walls, a first wall of the plurality of walls including one or more load ports; an EFEM chamber formed between the plurality of walls; an upper plenum at a top of the EFEM and including an opening into the EFEM chamber; and a plurality of ducts that provide a return gas flow path enabling recirculation of gas from the EFEM chamber to the upper plenum, wherein the plurality of ducts are proximate the one or more load ports, wherein one or more ducts of the plurality of ducts comprises a plurality of flow elements configured to cause a low pressure condition at a location of the one or more load ports. In some embodiments, the plurality of flow elements additionally or alternatively are configured to induce gas flow from the FOUP into the adjacent flow elements, which in turn induces flow from the EFEM into the FOUP.

Further disclosed herein according to at least one embodiment is an electronic device manufacturing assembly, comprising: an equipment front end module (EFEM) comprising: a plurality of walls, a first wall of the plurality of walls including one or more load ports; an EFEM chamber formed between the plurality of walls; an upper plenum at a top of the EFEM and including an opening into the EFEM chamber; and a plurality of ducts that provide a return gas flow path enabling recirculation of gas from the EFEM chamber to the upper plenum, wherein the plurality of ducts are proximate the one or more load ports, wherein one or more ducts of the plurality of ducts comprises a plurality of flow elements configured to cause a low pressure condition at a location of the one or more load ports; and one or more substrate carriers coupled to the one or more load ports.

In at least one further embodiment, disclosed herein is a method of operating an equipment front end module (EFEM), comprising: providing the EFEM comprising an upper plenum in fluid communication with an EFEM chamber, the EFEM chamber interfacing with one or more load ports; flowing gas from the upper plenum to the EFEM chamber; and recirculating at least some of the gas from the EFEM chamber to the upper plenum through a plurality of ducts positioned proximate the one or more load ports, wherein one or more ducts of the plurality of ducts comprises a plurality of flow elements configured to cause a low pressure condition at a location of the one or more load ports.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

According to one or more embodiments of the disclosure, electronic device manufacturing systems and associated methods as described herein provide improved substrate processing. For example, the described systems and methods provide efficiency and processing improvements in the manufacture of substrates by controlling environmental exposure of the substrates and, in particular, by controlling conditions within one or more front opening unified pod (FOUP) coupled to an equipment front end module (EFEM). At least one storage container may be contained within a FOUP and include a plurality of substrate holders (e.g., shelves) configured to receive and support substrates thereon, such as during idle periods before and/or after processing of the substrates. The systems and methods described herein may further provide EFEMs having reduced i) cost of operation, ii) cost of manufacture; and iii) complexity. In one or more embodiments, the EFEMs are free of gas purging equipment for purging the load port with $N_2$ or clean dry air (CDA) and are able to provide a non-reactive environment without purging the load port.

According to at least one embodiment, an EFEM includes one or more ducts (also referred to herein as flow transformation ducts) positioned adjacent to the load ports. The ducts include a plurality of flow elements (e.g., such as holes) that cause a low pressure environment at a location of the load ports (e.g., in front of the FOUP) and induce airflow and gas mixing between an environment of (e.g., gases in) the FOUP and an environment of (e.g., gases in) the EFEM. The ducts may exert a suction, pulling gases/air from the EFEM up through the ducts. The plurality of flow elements may cause gases/air from the FOUP to also flow up through the ducts, causing gases/air from the EFEM to replace and/or mix with the gases/air from the FOUP. In one embodiment, the plurality of flow elements create turbulence (e.g., a Bernoulli effect) in the gas flowing through the ducts of the EFEM, further increasing mixing of the gas/air in the EFEM with the gas/air in the FOUP.

Prior to docking the FOUP and/or opening the load ports, inert, low-humidity gas recirculates through the EFEM and its flow transformation ducts. The inert gas may recirculate through the ducts and flow from the bottom of the ducts to the top, across the load ports. The gas flowing across the load port doors and through the ducts may be considered return air. The inert gas may be $N_2$ or extreme clean dry air (xCDA) (e.g., CDA having a moisture content of less than about 0.33 ppm by weight). When the load ports open and the interior of the EFEM connects with the interior of the FOUP, the gas present in the FOUP is pulled into the recirculating duct and replaced by low humidity gas that was recirculating in the EFEM. This gas mixing serves to quickly lower in-FOUP moisture levels. Suitable flow elements (also referred to herein as flow transformation elements) include, but are not limited to, one or more openings (e.g., an orifice, hole or perforation). Flow elements such as divots, protrusions, fins, louvers, roughness elements, an increased surface roughness, and/or any other element that can induce turbulent flow and combinations of any two or more of the foregoing may also be used in addition to or instead of the one or more openings.

In embodiments, the flow elements comprise one or more openings in the ducts. The openings may be holes, perforations, grates, and so on. The openings may have various shapes, including circular shapes, rectangular shapes, square shapes, polygonal shapes, and so on. In some embodiments, the flow elements are about 1 mm to about 1 cm in diameter and are arranged in rows and columns, for example, rows of about 2 to about 5 openings arranged in about 1 to about 5 columns. At least one of the ducts may include on one side a first set of openings proximate a first load port and on an opposite side, a second set of openings proximate a second load port. The turbulence created by the flow elements induces mixing within and between the gases in the FOUP and the EFEM. This induced gas mixing combined with a low humidity environment within the EFEM facilitates quickly lowering the relative humidity (RH) and oxygen content within the FOUP. In some embodiments, there is an irregular pattern of flow elements (e.g., an irregular pattern of holes). For example, there may be varied spacing between holes, holes may have varied sizes, and so on. In one embodiment, the ducts include holes with a hole pattern in which there are a greater number and/or larger holes near a bottom of the FOUP and a smaller number of holes and/or smaller holes near a top of the FOUP. In one embodiment, the ducts include holes with a hole pattern in which there are a lesser number and/or smaller holes near a bottom of the FOUP and a greater number of holes and/or larger holes near a top of the FOUP. In one embodiment, the holes gradually change in size and/or number from a bottom of the FOUP to a top of the FOUP. This may result in a gradient in hole size and/or number of holes with height of the duct. In some embodiments, a first duct may have a first hole pattern and a second duct may have a second hole pattern that is different from the first hole pattern.

An EFEM having ducts according to one or more embodiments herein can reduce the relative humidity in a FOUP faster and achieve a lower steady state level of RH and oxygen than conventional EFEMs having nitrogen purged load ports. An EFEM as described herein that recirculates xCDA in combination with the perforated recirculating ducts can quickly generate an inert environment in a FOUP upon its connection to the EFEM without the use of nitrogen purged load ports including nitrogen supply and exhaust nozzles and corresponding actuators, mass flow controllers, piping, etc. As such, EFEMs according to embodiments provide improved performance and lower cost and increased reliability as compared to conventional EFEMs. EFEMs containing ducts as described herein improve the speed at which the atmosphere in the FOUP achieves suitable levels of humidity, oxygen and/or other parameters by about 20% to about 80% as compared to convention nitrogen purged systems.

Further details of example embodiments of EFEMs, substrate carriers, electronic device manufacturing assemblies including EFEMs and substrate carriers, and methods of operating EFEMs are described herein with reference to FIGS. 1-4 herein.

Figure 1:
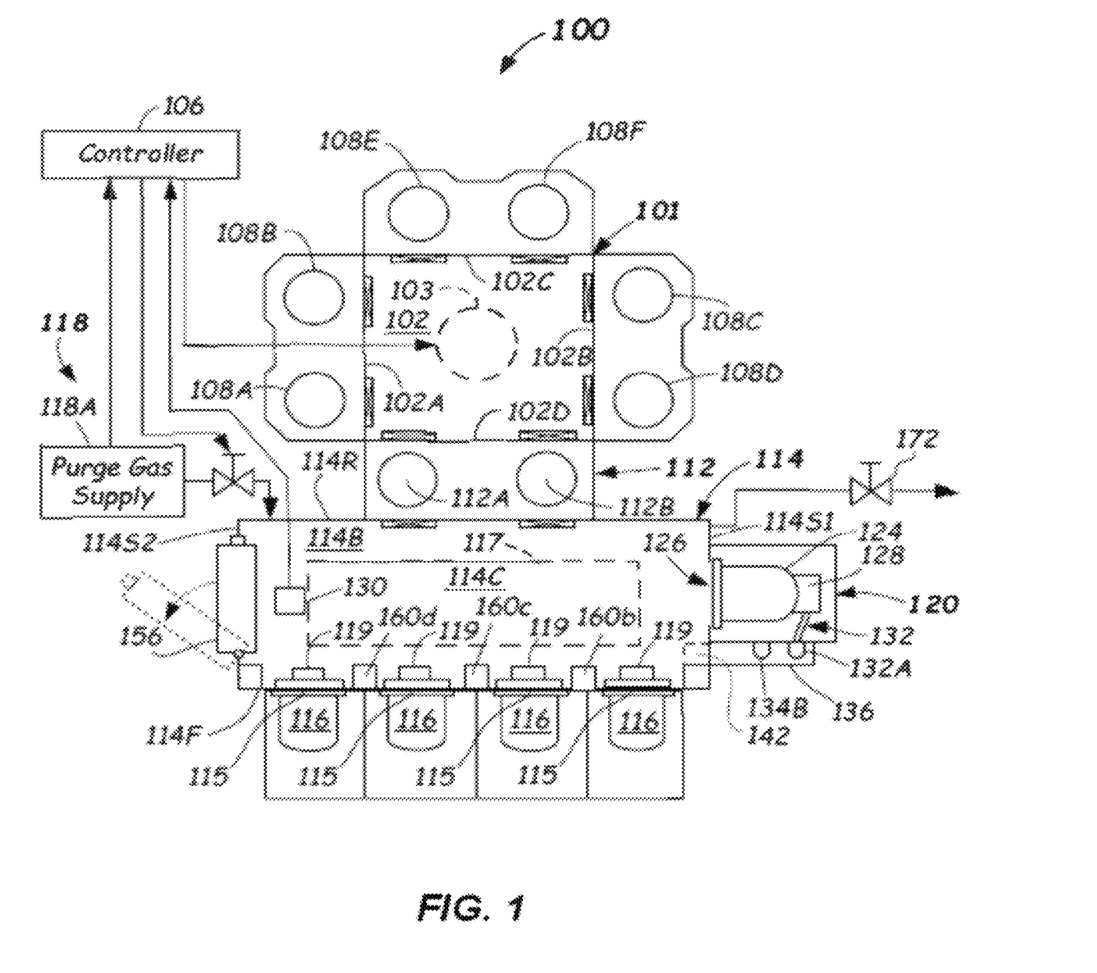
FIG. 1 illustrates a schematic top view of an electronic device manufacturing assembly according to one or more embodiments of the disclosure.

FIG. 1 illustrates a schematic diagram of an example embodiment of an electronic device manufacturing assembly 100 according to one or more embodiments of the present disclosure. The electronic device manufacturing assembly 100 may include a mainframe housing 101 having housing walls defining a transfer chamber 102. A transfer robot 103 (shown as a dotted circle) may be at least partially housed within the transfer chamber 102. The transfer robot 103 may be configured to place and remove substrates to and from various destinations via operation of arms (not shown) of the transfer robot 103. "Substrates" as used herein may refer to articles used to make electronic devices or circuit components, such as semiconductor wafers, silicon-containing wafers, patterned wafers, glass plates, and the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, and the like.

The transfer chamber 102 as shown is square, but could be rectangular, hexagonal, octagonal, or another polygonal shape and may include a first wall 102A, second wall 102B, a third wall 102C, and a fourth wall 102D. In the embodiment shown, the transfer robot 103 can transfer and/or retract dual substrates at the same time. The first wall 102A, second wall 102B, third wall 102C, and fourth wall 102D may be planar and entryways into the sets of process chambers may lie along the respective walls. However, other suitable shapes of the mainframe housing 101, numbers of walls and process chambers, and types of robots are possible.

The destinations for the transfer robot 103 may be any one or more of the process chambers 108A-108F, which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, and the like. Other processes may be carried out on substrates therein.

Substrates may be received into the transfer chamber 102 from an EFEM 114, and may exit the transfer chamber 102 to the EFEM 114, through a load lock apparatus 112, which is coupled to a rear wall 114R of the EFEM 114. The load lock apparatus 112 may include one or more load lock chambers (e.g., load lock chambers 112A and 112B) therein. Load lock chambers 112A and 112B may be single wafer load lock (SWLL) chambers, multi-wafer chambers, or combinations thereof. Other numbers of load locks may be included.

The EFEM 114 may be an enclosure having various enclosure walls, such as, e.g., front wall 114F, rear wall 114R, two side walls 114S1, 114S2, a top 114T (FIG. 2A), and a bottom 114B, forming an EFEM chamber 114C. Each of the front 114F, rear 114R, and two side walls 114S1, 114S2 may have one or more interface openings to facilitate substrate exchange and/or coupling to other components. One or more load ports 115 may be provided on the front wall 115F of the EFEM 114 as shown in FIG. 1. The one or more load ports 115 may each be configured to receive and dock with a respective one or more substrate carrier 116 (e.g., FOUP). Although four load ports 115 and four substrate carriers 116 are shown, other embodiments may have more or fewer load ports 115 suitable for docking a respective number of substrate carriers 116 at the EFEM 114.

EFEM 114 may include a suitable load/unload robot 117 (shown dotted) of conventional construction within the EFEM chamber 114C thereof. The load/unload robot 117 may be configured and operational, once a carrier door of a substrate carrier 116 is opened via a carrier door opener 119 for each of the load ports 115, to extract substrates from the substrate carrier 116 and to feed the substrates through the EFEM chamber 114C and into the one or more load lock chambers 112A and 112B of the load lock apparatus 112.

The side storage pod 120 may be coupled to a sidewall 114S1 of the EFEM 114. In particular, the load/unload robot 117 may further be configured to extract substrates from and load substrates into the side storage pod 120 prior to and/or after processing in one or more of the process chambers 108A-108F. In some embodiments, the load/unload robot 117 is a high-Z robot configured to access substrates stacked 26 high, or even 52 high or higher, in the side storage pod 120.

In the embodiment shown, the EFEM chamber 114C may be provided with environmental controls providing an environmentally-controlled atmosphere therein. In particular, an environmental control apparatus 118 may be coupled to the EFEM 114 and may be operational to monitor and/or control environmental conditions within the EFEM chamber 114C. In some embodiments, and at certain times, the EFEM chamber 114C may receive a purge gas (e.g., an inert and/or non-reactive gas) therein, such as, e.g., argon (Ar), nitrogen ($N_2$), helium (He), or clean dry air from purge gas supply 118A. The purge gas supply 118A may be coupled by suitable conduits and one or more valves to the EFEM chamber 114C. The environmental conditions within the EFEM chamber 114C may be within the interiors of side storage containers 124 located within and as part of the side storage pod 120. The side storage containers 124 receive substrates vertically stacked therein. In some embodiments, the side storage pod 120 may have substrate holders located therein to receive and support substrates.

In more detail, the environmental control system 118 may control at least one of: 1) relative humidity (RH), 2) temperature (T), 3) an amount of oxygen ($O_2$), and/or 4) an amount of purge gas, within the EFEM chamber 114C. Other environmental conditions of the EFEM 114 may be monitored and/or controlled, such as gas flow rate into the EFEM chamber 114C, or pressure within the EFEM chamber 114C, or both.

In some embodiments, environmental control system 118 includes the controller 106. Controller 106 may include suitable processor, memory, and electronic components for receiving inputs from various sensors and for controlling one or more valves to control the environmental conditions within the EFEM chamber 114C. Environmental control system 118 may, in one or more embodiments, monitor relative humidity (RH) by sensing RH in the EFEM 114 with a sensor 130. Any suitable type of sensor that measures relative humidity may be used, such as a capacitive-type sensor. The RH may be lowered by flowing a suitable amount of purge gas from the purge gas supply 118A of the environmental control system 118 into the EFEM chamber 114C. In some embodiments, compressed bulk inert gases having low $H_2O$ levels (e.g., purity≥99.9995%, $H_2O$≤5 ppm) may be used as the purge gas supply 118A in the environmental control system 118, for example. Other suitably low $H_2O$ levels may be used.

In another aspect, the sensor 130 may measure a plurality of environmental conditions. For example, in some embodiments, the sensor 130 may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device manufacturing assembly 100 or particular substrates exposed to the environment of the EFEM 114.

The environmental monitor 130 may also measure a level of oxygen ($O_2$) within the EFEM 114. In some embodiments, a control signal from the controller 106 to the environmental control apparatus 118 initiating a flow of a suitable amount of purge gas from the purge gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device manufacturing assembly 100 or particular substrates exposed to the environment of the EFEM 114. In some embodiments, the sensor 130 may sense the level of oxygen in the EFEM chamber 114C to ensure it is above a safe threshold level to allow entry into the EFEM chamber 114C.

The sensor 130 may further measure the absolute or relative pressure within the EFEM 114. In some embodiments, the controller 106 may control the amount of flow of purge gas from the purge gas supply 118A into the EFEM chamber 114C to control the pressure in the EFEM chamber 114C.

In the embodiments shown herein, the controller 106 may include a processor, memory, and peripheral components configured to receive control inputs (e.g., relative humidity and/or oxygen) from the sensor 130 and to execute a closed loop or other suitable control scheme. In one embodiment, the control scheme may change a flow rate of the purge gas being introduced into the EFEM 114 to achieve a predetermined environmental condition therein. In another embodiment, the control scheme may determine when to transfer substrates into the EFEM 114 or when to open the door of the substrate carrier 116.

The side storage pod 120 attached to the EFEM 114 may store substrates under specific environmental conditions. For example, the side storage pod 120 may store the substrates in the same environmental conditions as are present in the EFEM chamber 114C, except the gas flow rate in the side storage pod 120 may be different, such as significantly greater. The side storage pod 120 may be fluidly coupled to the EFEM chamber 114C and may receive gas (e.g., purge gas) from the EFEM chamber 114C. The side storage pod 120 may include exhaust conduits 132 that exhaust gas from the side storage pod 120, which further enables the substrates stored in the side storage pod 120 to be constantly exposed to the desired environmental conditions and purge gas flow rate.

In some embodiments, the side storage pod 120 may receive one or more vertically-aligned side storage containers 124). For example, a first side storage container 124 may be received in the side storage pod 120. The first side storage container 124 may include an opening 126 that faces the EFEM chamber 114C. The first side storage container 124 may also include an exhaust plenum 128 located opposite the opening 126. The exhaust plenum 128 may be coupled to an exhaust conduit 132 that may couple between the exhaust plenum 128 and an exterior of the side storage pod 120.

The first exhaust conduit 132 may be made up of an internal portion and a first external portion 132A. A second conduit may be coupled between a second side storage container and may include a second external portion 134B. Both the first external portion 134A and the second external portion 134B may be located within a cover 136. In some embodiments, the cover 136, rather than the first external portion 134A and the second external portion 134B, may function as a conduit to exhaust the exhausted gas from the side storage containers 124 and 224. In other embodiments, the first external portion 134A and the second external portion 134B may pass through the interior of the side storage pod 120.

FIGS. 2A-2D illustrate simplified front cross-sectional, side views and perspective view of the EFEM 114 including the side storage pod 120 coupled to a first sidewall 114S1 of the EFEM 114, in accordance with embodiments. The side storage pod 120 may include a first chamber 230 that receives the first side storage container 124 and a second chamber 233 that receives the second side storage container 224. The second side storage container 224 may include an opening 226 that faces the EFEM chamber 114C. The second side storage container 224 may also include a second exhaust plenum 228 located opposite the opening 226. The second exhaust plenum 228 may be coupled to a second exhaust conduit 234 that may couple between the exhaust plenum 228 and a common plenum 236.

Both the first external portion 134A and the second external portion 134B may be coupled to a common plenum 236 that receives the exhaust gas from the first plenum 128 of the first side storage container 124 and the second plenum 228 of the second side storage container 224. In some embodiments, the side storage pod 120 is removably attached to the first sidewall 114S1 of the EFEM 114. Purge gas may be drawn from the common plenum 236 by a series of fans located in or adjacent to the upper plenum 237. A duct 260a (e.g., a flow transformation duct) is coupled to a channel 142 extending from the common plenum 236 to direct the exhausted gas to the upper plenum 237.

An optional filter 248 may be provided in the exhaust gas flow path exiting the common plenum 236. For example, the filter 248 may be located at the entry into the channel 142 so that all the gas drawn by the fans (not shown) passes through the filter 248. In some embodiments, the filter 248 may be a chemical filter that filters one or more gases that are outgassed by one or more substrates 235 stored in the side storage pod 120 after application of a fabrication process. In some embodiments, the filter 248 can function to filter undesirable chemicals, such as chlorine, bromine, and/or fluorine. In some embodiments, the filter 248 may filter base gases, such as ammonia ($NH_3$), to less than or equal to 5.0 ppb. In some embodiments, the filter 248 may filter acidic gases, such as fluorine (F), chlorine (Cl), bromine (Br), acetate (OAc), nitrogen dioxide ($NO_2$), nitrate ($NO_3$), phosphate ($PO_4$), hydrogen fluoride (HF), and/or hydrochloric acid (HCl), to less than or equal to 1.0 ppb. In some embodiments, the filter 248 may comprise an activated carbon filter. In other embodiments, the filter 248 may be a particulate filter or include a combination particulate filter/chemical filter.

Optionally, a heater 250 may be provided along the exhaust gas flow path generated by the fans. The heater 250 may heat the exhaust gas to a predetermined temperature before the exhaust gas is recirculated into the upper plenum 237. In some embodiments, the heat generated by the heater 250 may be used as a reactant and/or to change the relative humidity in the EFEM 114 and/or in the side storage pod 120. In some embodiments, the heater 250 may heat the purge gas in the EFEM chamber 114C to increase a rate of outgassing from substrates 235 located in the side storage pod 120.

The fans thus draw gas (e.g., filtered gas) through the flow transformation duct 260a into the upper plenum 237 where the filtered gas is recirculated back into the EFEM chamber 114C. Further, the fans also draw gas from the EFEM chamber 114C through the return flow transformation ducts 260b-260e to the upper plenum 237, as shown in FIGS. 1 and 2A-2D (load/unload robot not shown for clarity). The plenum 154 has an opening located adjacent the sidewall of the EFEM 114 to which the side storage pod 120 is coupled. The common plenum 236 is configured to couple to the channel 142, which is coupled to a flow transformation duct.

An access door 156 is coupled to the second sidewall 114S2 of the EFEM 114. However, in some embodiments, a second side storage pod 120a may be attached to the second sidewall 114S2 of the EFEM 114 instead of the access door 156. In some embodiments, the second side storage pod 120a may be attached to the second sidewall 114S2 of the EFEM 114 in the same manner as the side storage pod 120 is attached to the first sidewall 114S1 of the EFEM 114, including similar or identical coupling to the common plenum 236. In this embodiment, the exhaust from the second side storage pod 120a is returned to the upper plenum 237 by the flow transformation duct 260e. Processed substrates within the side storage pod 120 and containers 124, 224 can benefit from high velocity gas flow therein to increase the outgassing rate of the etched byproducts such as Br, F and Cl. Although not shown, the gas inlet to each side storage container 124, 224 may include flow transformation elements that increase velocity and/or turbulence of the incoming gas.

Referring now to FIG. 2A-2D, each of the plurality of flow transformation ducts 260b-260e (FIG. 2A) and 260b-0260d (FIG. 2B) has a respective first (lower) end coupled to the EFEM chamber 114C. Each one of the plurality of flow transformation ducts 260b-260e (FIG. 2A) and 260b-0260d (FIG. 2B) may extend upward on an inside of the EFEM chamber 114C along the front wall 114F of the EFEM 114 and each may be parallel to one another, although they need not be. Each one of the plurality of flow transformation ducts also has a respective second (upper) end coupled to the upper plenum 237. The upper plenum 237 may extend horizontally across a top of the EFEM 114. The upper plenum 237 may have one or more inlets 240 into the EFEM chamber 114C. The inlets can include, above, below, or in, a particulate filter 267 and optionally a chemical filter 268. Further, a homogenization plate 141 including perforations may be provided proximate the one or more inlets 240 so as to cause a substantially laminar gas flow into and through the EFEM chamber 114C. Note that other embodiments may have more or less than the five flow transformation ducts 260a-260e shown.

Figure 2A:
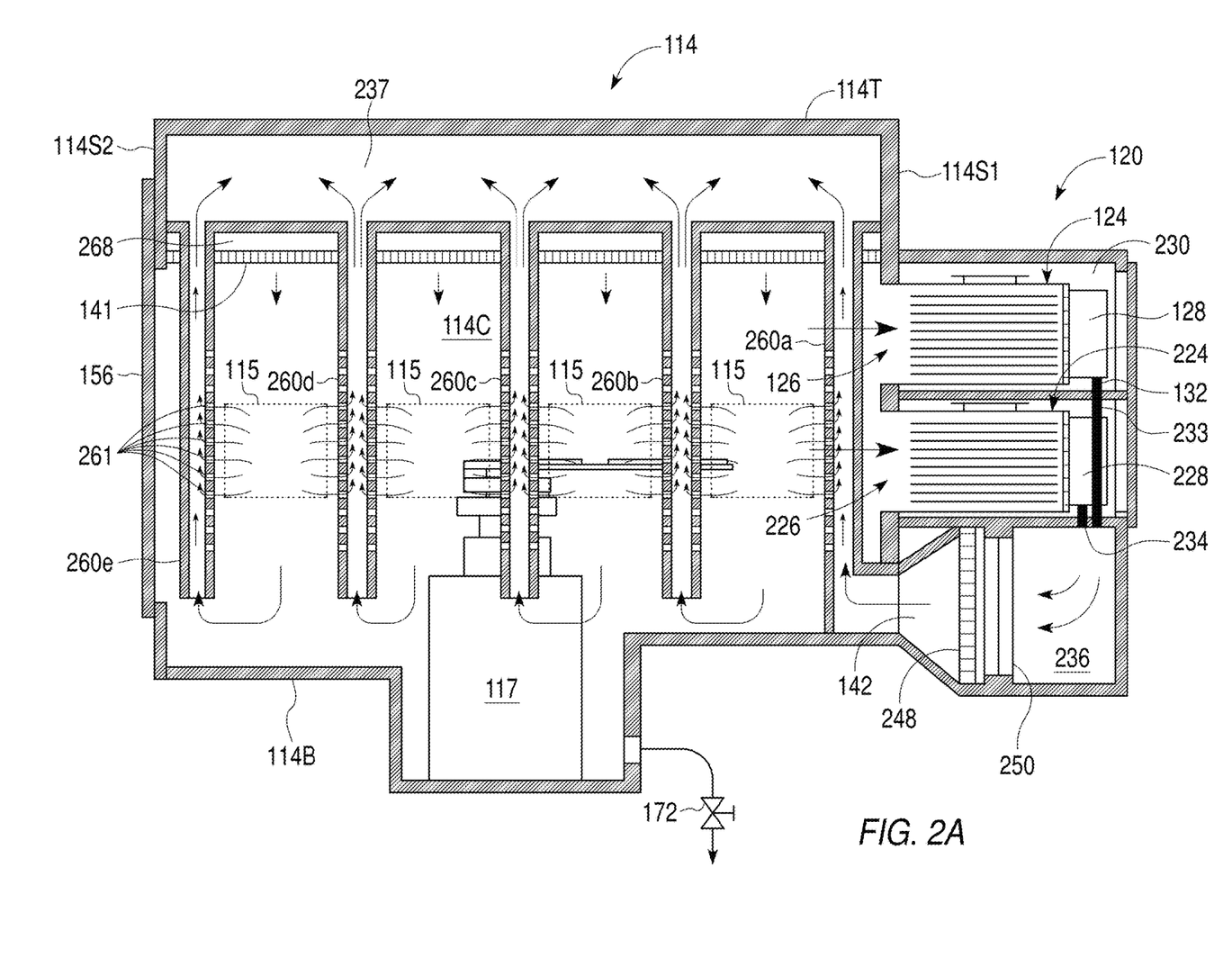
FIG. 2A illustrates a front cross-sectional view of a schematic of an equipment front end module (EFEM) including front return ducts according to one or more embodiments of the disclosure.
Figure 2B:
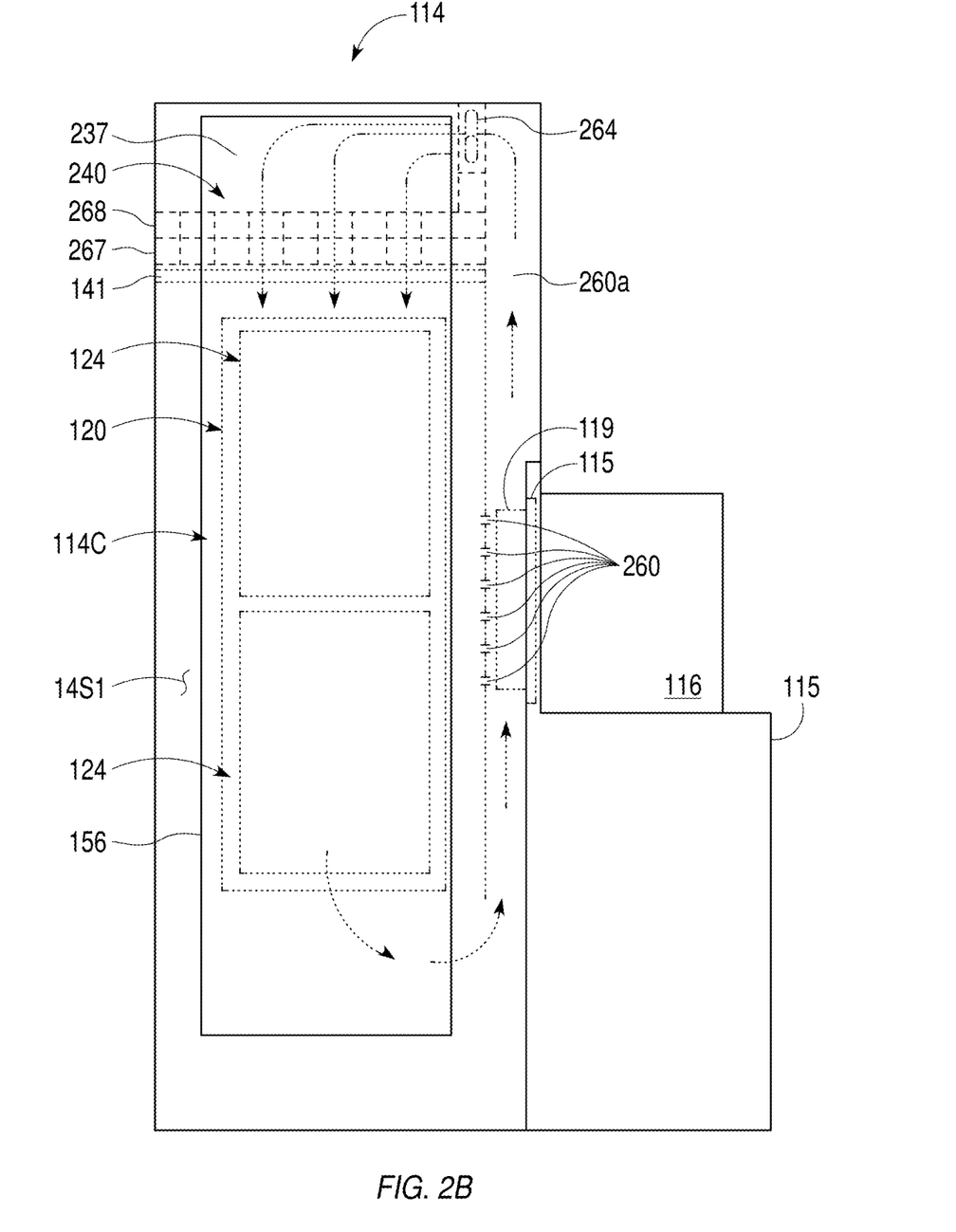
FIG. 2B illustrates a left side elevation view of the EFEM of FIG. 2A according to one or more embodiments of the disclosure.
Figure 2C:
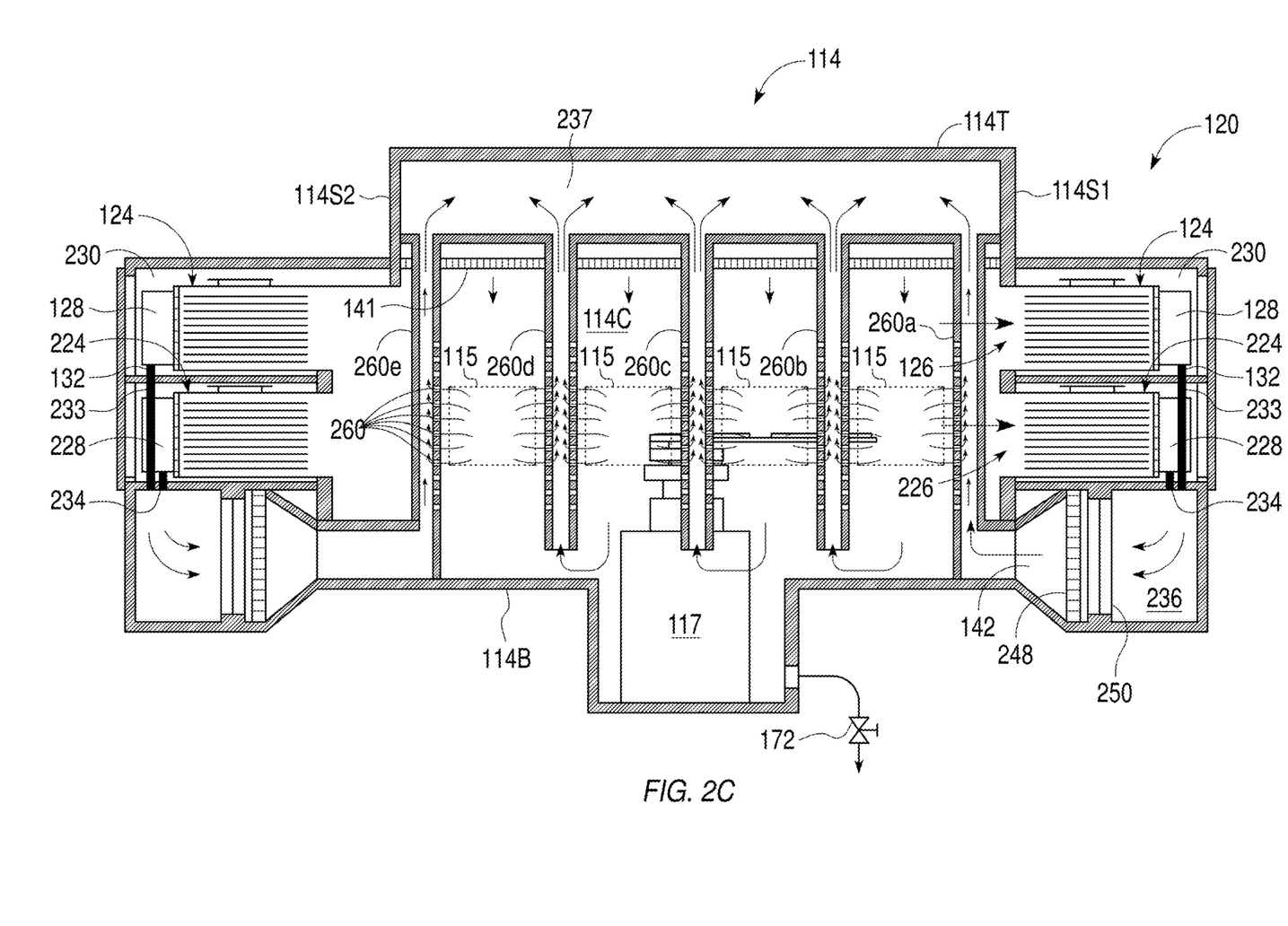
FIG. 2C illustrates a front view of the EFEM and a side storage pod coupled to the EFEM according to one or more embodiments of the disclosure.

As shown in FIGS. 2A-2D, the flow transformation ducts 260a-260e may run alongside of the inside of the front wall 114F of the EFEM and some may pass in between the load ports 115 (locations of load ports 115 shown in phantom in FIG. 2A). FIG. 2C illustrates a simplified front view of the EFEM 114 and a simplified side view of an embodiment of the side storage pod 120. As shown, each of the plurality of flow transformation ducts 260a-260e is configured to extend upward along a first vertical side of a carrier door opener 119 for a load port 115 (or substrate carrier 116) and another of the plurality of flow transformation ducts 260a-260e is configured to extend upward along a second vertical side of the carrier door opener 119 (or substrate carrier 116). In some embodiments, at least one of the plurality of flow transformation ducts 260a-260e is configured to extend upwardly between vertical sides of two adjacent carrier door openers 119 (or substrate carrier 116). In some embodiments, flow transformation ducts 260a-260e can have transverse cross-sectional areas of 100 mm$^2$ to 300 mm$^2$ or larger, and can be made from bent sheet metal or plastic.

Figure 2D:
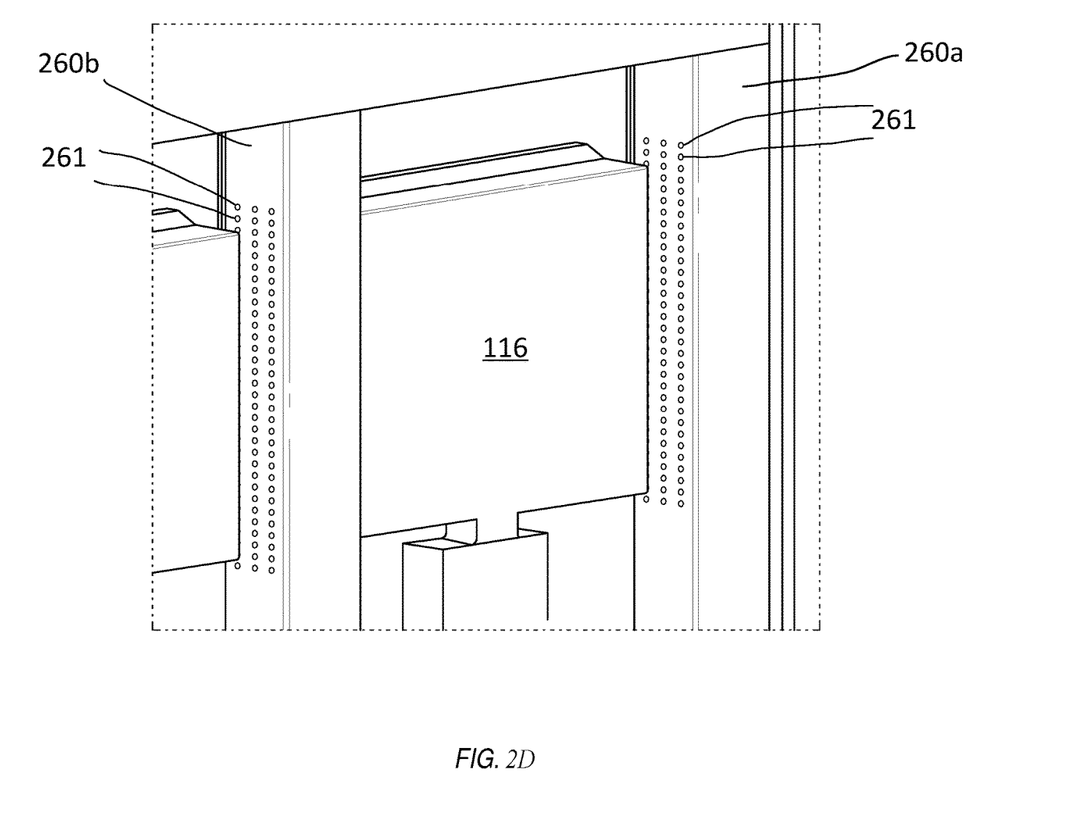
FIG. 2D illustrates a blown up perspective view of a pair of flow transformation ducts positioned adjacent a pair of load ports of an EFEM.

As shown in FIGS. 2A-2D, the EFEM flow transformation ducts 260a-260e are positioned adjacent the load ports 115 of the EFEM. Each flow transformation duct 260a-260e may include a plurality of flow transformation elements 261. Suitable flow elements 261 include, but are not limited to, one or more openings (e.g., an orifice, hole or perforation), divots, protrusions, fins, louvers, roughness elements, an increased surface roughness, any other element that can induce turbulent flow and combinations of any two or more of the foregoing. In some embodiments, the flow transformation elements include one or more through holes. In some embodiments, the flow transformation elements are about 1 mm to about 1 cm in diameter and are arranged in rows and columns, for example, rows of about 2 to about 5 openings arranged in about 1 to about 5 columns. The flow transformation elements 261 shown in FIGS. 2A-2D, are circular holes formed within sidewalls of the flow transformation ducts 260a-260d. The flow transformation elements 261 may be formed in rows and columns as shown in FIG. 2D. The flow transformation elements 261 may begin at or above a top of the load port 115 and continue down along the side of the load port until the bottom or below the bottom of the load port 261. The flow transformation ducts 260a-260e may include on one side a first set of openings 261 proximate a first load port 115 and on an opposite side, a second set of openings 261 proximate a second load port 115. In some embodiments, each set of openings 261 may be positioned along the height of a corresponding load port 115; alternatively or additionally each set of openings 261 may be positioned along the flow transformation ducts 260a-260e above and/or below a corresponding load port 115.

When one or more substrate carrier 116 is docked to one or more of the load ports 115, and at least one load port 115 opens, the environment within the one or more substrate carrier 116 is connected with the environment within the EFEM 114. The difference between the environment within the EFEM return duct (e.g., a lower pressure and a relative humidity of about 5 ppmV to about 100 ppmV and an oxygen concentration of about 10 ppmV to about 21% by volume) and the environment within the substrate carrier 116 (e.g., a higher pressure and a relative humidity of about 5% to about 40% by volume and an oxygen concentration of about 18% to about 21% by volume) causes gas to flow from the EFEM and into the FOUP. The flow transformation elements 261 cause gas from the EFEM to be sucked into the return ducts, and induce a low pressure region at or around (e.g., in front of) the FOUP. The flow transformation elements may also induce turbulence in the gas flowing from the EFEM to the FOUP in some embodiments. The low pressure condition at the FOUP and optionally the turbulence creates mixing between the gas within the EFEM and the gas within the FOUP, quickly lowering the relative humidity and oxygen content within the FOUP environment.

Figure 3A:
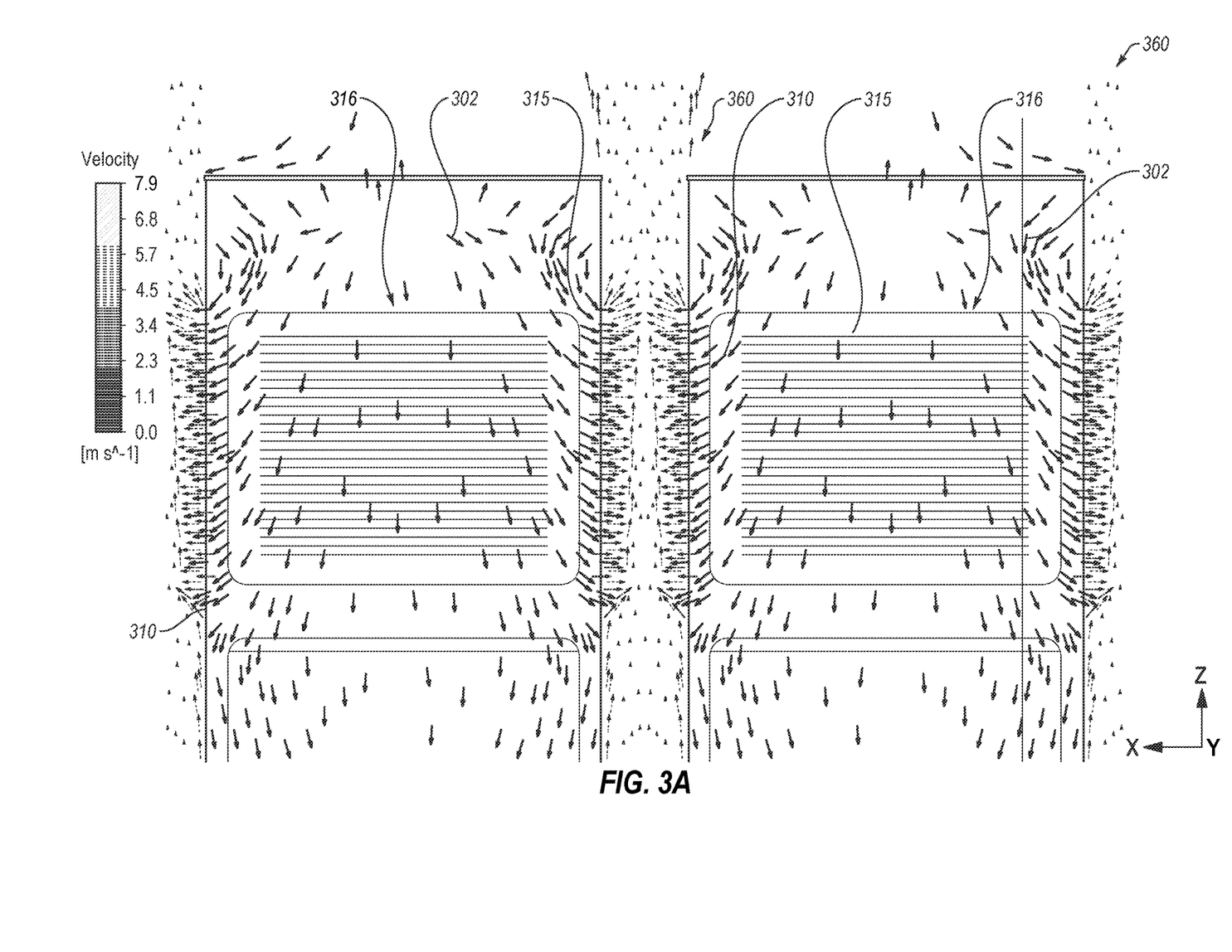
FIG. 3A is a chart illustrating theoretical gas flow through EFEM flow transformation ducts into FOUPs.
Figure 3B:
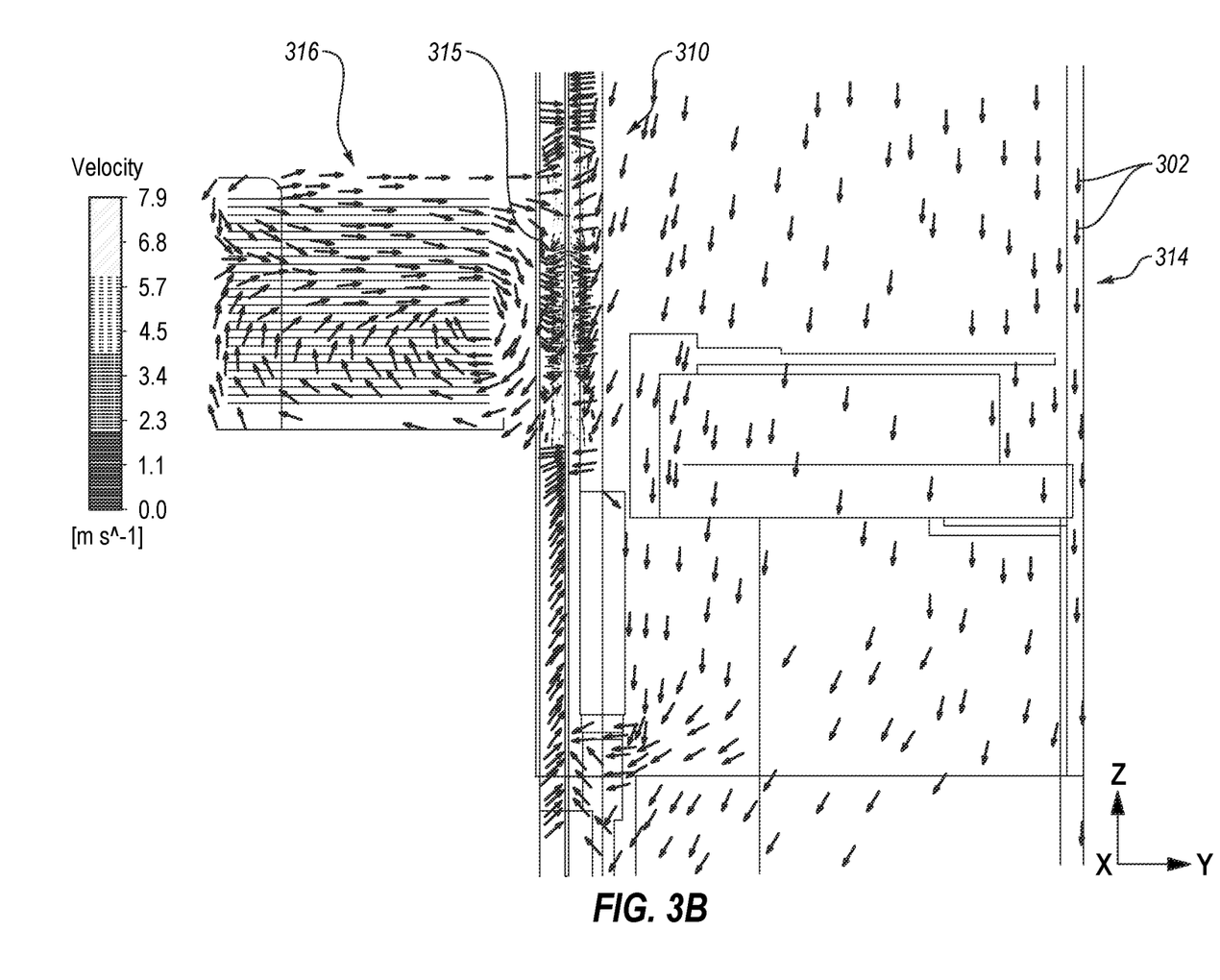
FIG. 3B is a chart illustrating theoretical gas flow through an EFEM flow transformation duct into a FOUP.

FIGS. 3A and 3B are charts illustrating theoretical gas flow through EFEM flow transformation ducts 360 into FOUPs 316. FIG. 3B is a side view (or cross section of FIG. 3A). Each flow transformation duct 360 contains one or more sets of a plurality of openings 310 according to embodiments herein. Gas flow is represented by the arrows 302. During operation, gas flows from tubes at the bottom of the flow transformation ducts 360 and up to a fan system (not shown). Fans within the fan system push the gas through one or more filters (not shown) and down to the tubes at the bottom of the flow transformation ducts 360 to create a gas recirculation loop. After the gas passes through the filters, it flows through the internal compartment of the EFEM as indicated by down arrows 302. When the load ports 315 between the EFEM 314 and the FOUP 316 open, gas flows through the plurality of openings 310 in the flow transformation ducts 360 creating a low pressure in front of the FOUP 316 and/or a turbulent flow and mixing with the gas within the FOUP.

As shown in FIGS. 3A and 3B, gas flows through the flow transformation ducts 360, optionally at a velocity of less than 1.1 m/s. Gas flow through the plurality of openings 310 is represented at the interface between the EFEM flow transformation duct 360 and the load port 315. The plurality of openings induce a low pressure environment at the load ports and/or FOUPs and optionally induce a turbulent flow of the gas, which may cause a Bernoulli effect. The gas flows through the plurality of openings 310 from the EFEM 314 to the FOUP 316 at a velocity of about 3.4 m/s to about 6.8 m/s, or about 4.5 m/s to about 5.7 m/s, or about 3.8 m/s to about 6.3 m/s in embodiments. On either side of the plurality of openings 310, the gas velocity is less than about 4.5 m/s, less than about 4.2 m/s, less than about 4.0 m/s, less than about 3.8 m/s, or less than about 3.4 m/s. Within the FOUP, the high gas velocity through the openings 310 mixes at a velocity of less than about 2.3 m/s or less than about 1.1. As shown in FIGS. 3A and 3B, the fluid transformation ducts 360 induce mixing of the EFEM gas with the FOUP gas such that the atmosphere within the FOUP can achieve target levels of inert gas in less than about 1 min. This can be achieved without the need for a separate $N_2$ or xCDA purge of the load port.

Figure 4:
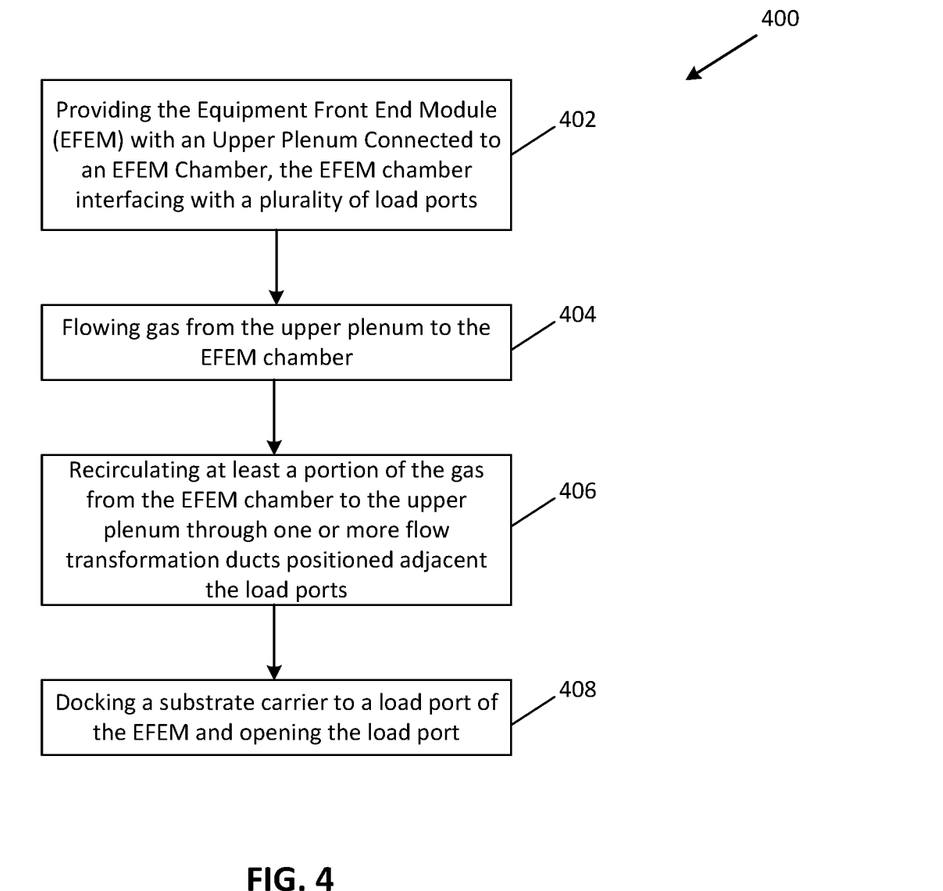
FIG. 4 illustrates a flowchart of a method of operating an EFEM according to one or more embodiments of the disclosure.

FIG. 4 illustrates a method 400 of operating an EFEM in an electronic device manufacturing assembly in accordance with one or more embodiments. At process block 402, method 400 may include providing the equipment front end module with an upper plenum connected to an equipment front end module chamber, the equipment front end module chamber interfacing with a plurality of load ports.

At process block 404, method 400 may include flowing gas from the upper plenum to the EFEM chamber. For example, referring to FIGS. 2A-2D, gas may flow from the upper plenum 237 to the inside of the EFEM chamber 114C. Some of the gas flow enters into the side storage pod 120 coupled to the EFEM 114 at the sidewall 114S1 of the EFEM 114. The one or more load ports 115 may be closed.

At process block 406, method 400 may include recirculating at least some of the gas from the EFEM chamber 114C to the upper plenum 237 through one or more flow transformation ducts 260a-260e positioned between the load ports 115. For example, each of the flow transformation ducts 260a-260e can extend vertically upward along an inside front wall 114F of the EFEM 114 into the upper plenum 237 of the EFEM and thereafter back down into EFEM chamber 114C. For example, referring to FIGS. 2A-2D, gas from the upper plenum 237 may flow through homogenization plate 141 and one or more filters into the EFEM chamber 114C. The filtered gas may flow from EFEM chamber 114C and common plenum 236, through the plurality of flow transformation ducts 260a-260e along the front wall 114F, into the upper plenum 237, and then back into the EFEM chamber 114C.

During operation, some of the gas provided from the purge gas supply 118A into the upper plenum 237 can be removed through a base valve 172. In some embodiments, the flow of new purge gas into the EFEM 114 can be provided at a relatively slow constant rate, as can the flow of the exhaust out through the base valve 172. For example, the purge gas can be exchanged from the EFEM 114 at a rate where the entire volume of gas present in the EFEM 114 is exchanged only every few hours or less, for example. Other exchange rates can be used.

At block 408, one or more substrate carrier 116 may be docked to the one or more load ports 115. Once completely docked and sealed, the one or more load ports 115 corresponding to the one or more substrate carriers 116 is opened to connect the atmosphere within the EFEM chamber 114C with the atmosphere within the corresponding substrate carrier 116. When a load port 115 is opened, the gas recirculating through the flow transformation ducts 260a-260e begins to flow through, past or over the flow transformation elements 261 of the flow transformation ducts 260a-260e adjacent to the load port 115. The flow transformation elements 261 cause gas flow from the substrate carrier through the flow transformation elements 261 for recirculation and create a low pressure region in front of the substrate carrier 116. The flow transformation elements also optionally cause turbulence in the gas as it flows into the substrate carrier 116. This low pressure region and/or turbulence induces mixing between the gases in the two atmospheres, quickly reducing the humidity and oxygen content within the substrate carrier 116 without the need to separately purge the load port 115.

Some of the advantages of the flow transformation-ducted EFEM 114 include generating a low pressure region at the FOUP, optionally causing turbulence in the gas flowing from the EFEM to the FOUP 116, and inducing of gas mixing between the EFEM and the FOUP 116, providing a low humidity environment within the EFEM (e.g., recirculating xCDA within the EFEM) and quickly lowering the relative humidity (RH) and oxygen content within the FOUP. Furthermore, the induced gas mixing between the EFEM and FOUP 116 may be accomplished without the use of purging the load ports 115 with nitrogen. In one or more embodiments, the systems as described herein include one or more fluid transformation ducts 260a-260e and are free of nitrogen purging equipment (e.g., nozzles, pressurized nitrogen supplies, piping, mass flow controllers, etc.). The flow transformation-ducted EFEM 114 according to embodiments herein may purge and evacuate a FOUP about 20% to about 80% faster than conventional EFEM systems.

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a robot arm" includes a single robot arm as well as more than one robot arm.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The foregoing description discloses example embodiments of the disclosure. Modifications of the above-disclosed assemblies, apparatus, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the following claims.

What is claimed is:

1. An equipment front end module (EFEM), comprising:
a plurality of walls, a first wall of the plurality of walls including one or more load ports;
an EFEM chamber formed between the plurality of walls;
an upper plenum at a top of the EFEM and including an opening into the EFEM chamber; and
a plurality of ducts that provide a return gas flow path enabling recirculation of gas from the EFEM chamber to the upper plenum, wherein the plurality of ducts are proximate the one or more load ports, wherein one or more ducts of the plurality of ducts comprises a plurality of flow elements disposed proximate a location of the one or more load ports and configured to cause a low pressure condition at the location of the one or more load ports.

2. The equipment front end module of claim 1, wherein the one or more ducts extend along the first wall.

3. The equipment front end module of claim 2, wherein at least one of the plurality of ducts is configured to extend between two adjacent load ports.

4. The equipment front end module of claim 1, wherein the one or more load ports is configured to receive one or more substrate carriers, and wherein the plurality of flow elements are configured to cause the low pressure condition to facilitate intermixing of a first environment of the one or more substrate carriers with a second environment of the EFEM.

5. The equipment front end module of claim 4, wherein an internal chamber of the one or more substrate carriers is to be open to the EFEM chamber while the one or more substrate carriers are coupled to the one or more load ports.

6. The equipment front end module of claim 1, wherein the plurality of flow elements comprises one or more of openings, orifices, holes, or a combination of any two or more of the foregoing.

7. The equipment front end module of claim 1, wherein each of the plurality of flow elements has a diameter of about 1 mm to about 1 cm.

8. The equipment front end module of claim 1, wherein the plurality of flow elements are arranged in or on the one or more ducts in rows and columns and are arranged proximate to the one or more load ports.

9. The equipment front end module of claim 1, wherein the plurality of flow elements are configured to induce turbulence in at least some of the gas flowing through the one or more ducts.

10. The equipment front end module of claim 1, wherein at least one duct of the one or more ducts comprises a first side having a first set of flow elements proximate a first load port and an opposite second side having a second set of flow elements proximate a second load port.

11. An electronic device manufacturing assembly, comprising:
an equipment front end module (EFEM) comprising:
a plurality of walls, a first wall of the plurality of walls including one or more load ports;
an EFEM chamber formed between the plurality of walls;
an upper plenum at a top of the EFEM and including an opening into the EFEM chamber; and
a plurality of ducts that provide a return gas flow path enabling recirculation of gas from the EFEM chamber to the upper plenum, wherein the plurality of ducts are proximate the one or more load ports, wherein one or more ducts of the plurality of ducts comprises a plurality of flow elements disposed proximate a location of the one or more load ports and configured to cause a low pressure condition at the location of the one or more load ports; and
one or more substrate carriers coupled to the one or more load ports.

12. The electronic device manufacturing assembly of claim 11, wherein the one or more ducts extend along the first wall.

13. The electronic device manufacturing assembly of claim 11, wherein at least one of the plurality of ducts is configured to extend between two adjacent load ports.

14. The electronic device manufacturing assembly of claim 11, wherein the plurality of flow elements comprises one or more of openings, orifices, holes, perforations, or a combination of any two or more of the foregoing.

15. The electronic device manufacturing assembly of claim 11, wherein the plurality of flow elements are arranged in or on each duct in rows and columns.

16. The electronic device manufacturing assembly of claim 11, wherein each of the plurality of flow elements are arranged proximate the one or more load ports.

17. The electronic device manufacturing assembly of claim 11, wherein at least one duct of the one or more ducts comprises a first side having a first set of flow elements proximate a first load port and an opposite second side having a second set of flow elements proximate a second load port.

* * * * *